United States Patent
Koike et al.

(10) Patent No.: US 12,371,795 B2
(45) Date of Patent: Jul. 29, 2025

(54) CUTTING TOOL

(71) Applicant: Sumitomo Electric Hardmetal Corp., Itami (JP)

(72) Inventors: Sachiko Koike, Itami (JP); Haruyo Fukui, Itami (JP); Keiichi Tsuda, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 466 days.

(21) Appl. No.: 17/922,381

(22) PCT Filed: Sep. 8, 2021

(86) PCT No.: PCT/JP2021/032975
§ 371 (c)(1),
(2) Date: Oct. 31, 2022

(87) PCT Pub. No.: WO2022/130706
PCT Pub. Date: Jun. 23, 2022

(65) Prior Publication Data
US 2023/0265565 A1   Aug. 24, 2023

(30) Foreign Application Priority Data

Dec. 16, 2020   (JP) .................... 2020-208258

(51) Int. Cl.
C23C 28/00   (2006.01)
B23B 27/14   (2006.01)
C23C 28/04   (2006.01)

(52) U.S. Cl.
CPC .............. *C23C 28/42* (2013.01); *B23B 27/14* (2013.01); *C23C 28/042* (2013.01); *C23C 28/044* (2013.01); *B23B 2228/105* (2013.01)

(58) Field of Classification Search
CPC .............. B23B 27/14; B23B 2228/105; C23C 14/0635; C23C 28/044; C23C 28/40; C23C 30/005; C23C 28/44
See application file for complete search history.

(56) References Cited

U.S. PATENT DOCUMENTS 4,855,188 A   8/1989   Garg et al.
2005/0126335 A1   6/2005   Norgren et al.
(Continued)

FOREIGN PATENT DOCUMENTS

CN   110691664 A   1/2020
JP   54-152281 A   11/1979
(Continued)

OTHER PUBLICATIONS

Office Action issued on Oct. 18, 2024, in corresponding Chinese patent Application No. 202180038561.9, 12 pages; as concise explanation of relevance for Non-English language information.
(Continued)

*Primary Examiner* — Jaehwan Oh
(74) *Attorney, Agent, or Firm* — XSENSUS LLP (57) ABSTRACT

A cutting tool includes a substrate and a coating film that is disposed on the substrate, wherein the coating film includes a first layer composed of metal tungsten and hexagonal ditungsten carbide, and the first layer has an elastic deformation rate of 43.0 or more and 58.0 or less.

15 Claims, 4 Drawing Sheets

(56) References Cited

U.S. PATENT DOCUMENTS

| | | | |
|---|---|---|---|
| 2005/0148676 A1* | 7/2005 | Doi | C08F 290/06 520/1 |
| 2005/0225855 A1* | 10/2005 | Doi | G02B 3/08 359/457 |
| 2012/0087695 A1* | 4/2012 | Nagai | G03G 5/14791 430/57.1 |
| 2015/0168856 A1* | 6/2015 | Kurimoto | G03G 5/142 430/57.1 |
| 2017/0314102 A1* | 11/2017 | Roy | E21B 23/01 |
| 2019/0111495 A1 | 4/2019 | Maekawa et al. | |
| 2020/0171582 A1 | 6/2020 | Koike et al. | |
| 2023/0063115 A1* | 3/2023 | Schier | C23C 14/3485 |

FOREIGN PATENT DOCUMENTS

| | | |
|---|---|---|
| JP | 61-46550 B2 | 10/1986 |
| JP | 62-57802 A | 3/1987 |
| JP | 1-246363 A | 10/1989 |
| JP | H06-079503 A | 3/1994 |
| JP | 6-262405 A | 9/1994 |
| JP | H08-025112 A | 1/1996 |
| JP | 2000-015502 A | 1/2000 |
| JP | 2011-218513 A | 11/2011 |
| JP | 2015-124407 A | 7/2015 |
| JP | 2018-94669 A | 6/2018 |
| KR | 2005-0030231 A | 3/2005 |
| WO | 2017/154730 A1 | 9/2017 |

OTHER PUBLICATIONS

Guo Yan et al., "Microstructure and tribological properties of Ni-based WC particles reinforced composite clad layer", Heat Treatment of Metals, vol. 42, No. 8, Aug. 25, 2017, pp. 6-10. See the English translation of the Chinese Office Action dated Oct. 18, 2024 for concise explanation of relevance.

* cited by examiner

CUTTING TOOL

CROSS-REFERENCE TO RELATED APPLICATIONS

The present application is based on PCT filing PCT/JP2021/032975, filed Sep. 8, 2021, which claims priority to JP 2020-208258, filed Dec. 16, 2020, the entire contents of each are incorporated herein by reference.

TECHNICAL FIELD

The present disclosure relates to a cutting tool.

BACKGROUND ART

Various studies have been conducted in order to achieve a long life of a cutting tool. Japanese Patent Laying-Open No. 06-262405 (Patent Literature 1) discloses a coating component for cutting tools or polishing tools, wherein a coating film containing 30 volume % a or more of cubic tungsten carbide and having a film thickness of 0.5 to 100 μm exists on a surface of a substrate.

Japanese Patent Laying-Open No. 54-152281 (Patent Literature 2) discloses a surface-coated tool having a coating layer formed of one or two of tungsten and tungsten carbide.

CITATION LIST

Patent Literature

PTL 1: Japanese Patent Laying-Open No. 06-262405
PTL 2: Japanese Patent Laying-Open No. 54-152281

SUMMARY OF INVENTION

A cutting tool of the present disclosure is a cutting tool including a substrate and a coating film that is disposed on the substrate, wherein the coating film includes a first layer composed of metal tungsten and hexagonal ditungsten carbide, and the first layer has an elastic deformation rate of 43.0 or more and 58.0 or less.

DETAILED DESCRIPTION

Problems to be Solved by the Present Disclosure

There is a demand for a cutting tool having a long tool life even in environments with a high heat load such as during the milling of a titanium alloy.

Therefore, an object of the present disclosure is to provide a cutting tool having a long tool life even in environments with a high heat load such as, in particular, during the milling of a titanium alloy.

Advantageous Effect of the Present Disclosure

It is possible for a cutting tool of the present disclosure to have a long tool life even in environments with a high heat load such as during the milling of a titanium alloy.

DESCRIPTION OF EMBODIMENTS

First, embodiments of the present disclosure will be listed and described.

(1) A cutting tool of the present disclosure is a cutting tool including a substrate and a coating film that is disposed on the substrate, wherein
  the coating film includes a first layer composed of metal tungsten and hexagonal ditungsten carbide, and
  the first layer has an elastic deformation rate of 43.0 or more and 58.0 or less.

It is possible for a cutting tool of the present disclosure to have a long tool life even in environments with a high heat load such as during the milling of a titanium alloy.

(2) The first layer preferably has a thickness of 0.3 μm or more and 4.0 μm or less. This improves the breakage resistance and wear resistance of the tool.

(3) It is preferable that the coating film further includes a second layer that is disposed on the first layer,
  the second layer includes at least a first unit layer having a composition different from a composition of the first layer, and
  the first unit layer is composed of at least one element selected from a group consisting of a group 4 element, a group 5 element, a group 6 element in a periodic table, aluminum and silicon, or is composed of a compound composed of at least one of the elements and at least one element selected from a group consisting of carbon, nitrogen, oxygen and boron.

This improves the breakage resistance and wear resistance of the tool.

(4) It is preferable that the second layer further includes a second unit layer,
  the second unit layer has a composition different from compositions of the first layer and the first unit layer,
  the second unit layer is composed of at least one element selected from a group consisting of a group 4 element, a group 5 element, a group 6 element in a periodic table, aluminum and silicon, or is composed of a compound composed of at least one of the elements and at least one element selected from a group consisting of carbon, nitrogen, oxygen and boron, and
  one or a plurality of the first unit layers and one or a plurality of the second unit layers are layered alternately on each other to form a multilayer structure.

This improves the breakage resistance and wear resistance of the tool.

(5) It is preferable that the first unit layer has a thickness of 1 nm or more and 100 nm or less and the second unit layer a thickness of 1 nm or more and 100 nm or less. This improves the breakage resistance and wear resistance of the tool.

(6) It is preferable that the coating film further includes a third layer that is disposed below the first layer, the third layer includes at least a 1A unit layer having a composition different from a composition of the first layer, and the 1A unit layer is composed of at least one element selected from a group consisting of a group 4 element, a group 5 element, a group 6 element in a periodic table, aluminum and silicon, or is composed of a compound composed of at least one of the elements and at least one element selected from a group consisting of carbon, nitrogen, oxygen and boron.

This improves the breakage resistance and wear resistance of the tool.

(7) It is preferable that the third layer further includes a 2A unit layer, the 2A unit layer has a composition different from compositions of the first layer and the 1A unit layer, the 2A unit layer is composed of at least one element selected from a group consisting of a group 4 element, a group 5 element, a group 6 element in a periodic table, aluminum and silicon, or is composed of a compound composed of at least one of the elements and at least one element selected from a group consisting of carbon, nitrogen, oxygen and boron, and one or a plurality of the 1A unit layers and one or a plurality of the 2A unit layers are layered alternately on each other to form a multilayer structure.

This improves the breakage resistance and wear resistance of the tool.

(8) It is preferable that the 1A unit layer has a thickness of 1 nm or more and 100 nm or less and the 2A unit layer has a thickness of 1 nm or more and 100 nm or less. This improves the breakage resistance and wear resistance of the tool.

(9) It is preferable that the substrate includes at least one selected from a group consisting of a cemented carbide, a cermet, a high-speed steel, a ceramic, a cBN sintered material and a diamond sintered material. This makes the tool be excellent in terms of hardness and strength at high temperatures.

Details of Embodiments of Present Disclosure

Hereinafter, a specific example of a cutting tool of one embodiment of the present disclosure (hereinafter, also referred to as "the present embodiment") will be described with reference to the drawings. In the drawings of the present disclosure, the same reference sign indicates the same portions or equivalent portions. Moreover, dimensional relationships of lengths, widths, thicknesses, depths and the like have been modified as appropriate in order for the clarification and simplification of the drawings and do not necessarily indicate actual dimensional relationships.

In the present specification, the expression "A to B" represents a range of lower to upper limits (i.e., A or more and B or less). When no unit is indicated for A and a unit is indicated only for B, the unit of A is the same as the unit of B.

When a compound or the like is herein represented by a chemical formula and when the atomic proportions are not particularly limited, the atomic proportions include all conventionally-known atomic proportions and am not necessarily limited only to atomic proportions within the stoichiometric ranges. For example, in the case of "TiN", the proportions of the number of atoms constituting TiN include all conventionally-known atomic proportions.

Embodiment 1: Cutting Tool

The cutting tool of the present embodiment is a cutting tool including a substrate and a coating film that is disposed on the substrate, wherein the coating film includes a first layer composed of metal tungsten and hexagonal ditungsten carbide, and the first layer has an elastic deformation rate of 43.0 or more and 58.0 or less.

It is possible for the cutting tool of the present embodiment to have a long tool life even in environments with a high heat load such as during the milling of a titanium alloy. The reason therefor is not clear, but is assumed that the first layer contains metal tungsten and hexagonal ditungsten carbide and thereby suppresses a diffusion reaction between the coating film and a workpiece.

Examples of the cutting tool of the present embodiment include a drill, an end mill, an indexable cutting insert for a drill, an indexable cutting insert for an end mill, an indexable cutting insert for milling, an indexable cutting insert for milling operation, a metal saw, a gear cutting tool, a reamer, a tap and the like.

Figure 1:
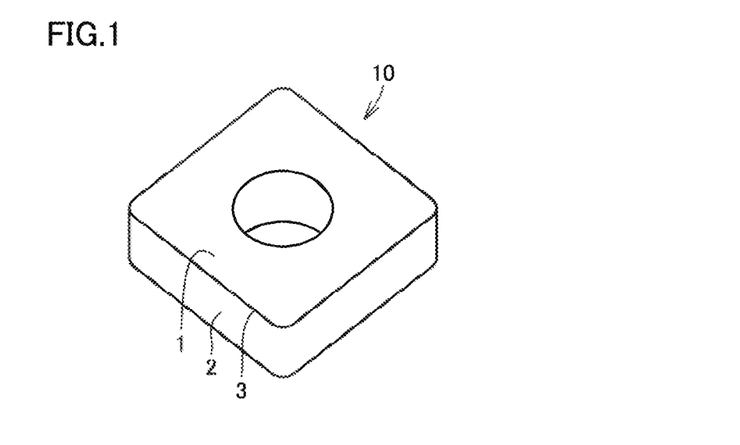
FIG. 1 is a perspective view illustrating one implementation of a cutting tool.

FIG. 1 is a perspective view illustrating one implementation of the cutting tool. The cutting tool having such a shape is used as an indexable cutting insert, for example. Cutting tool 10 has a rake face 1, a flank face 2, and a cutting edge ridgeline portion 3 at which rake face 1 and flank face 2 cross each other. That is, rake face 1 and flank face 2 are surfaces connected to each other with cutting edge ridgeline portion 3 being interposed therebetween. Cutting edge ridgeline portion 3 constitutes a cutting edge tip portion of cutting tool 10. It can be also understood that the shape of such a cutting tool 10 corresponds to the shape of the substrate of the cutting tool. That is, the substrate has the rake face, the flank face, and the cutting edge ridgeline portion that connects the rake face and the flank face to each other.

<Substrate>

For the substrate of the present embodiment, a conventionally known substrate for such a purpose of use can be used. For example, the substrate preferably includes at least one selected from a group consisting of: a cemented carbide (for example, a tungsten carbide (WC) based cemented carbide, a cemented carbide including Co in addition to WC, or a cemented carbide having a carbonitride of Cr, Ti, Ta, and Nb, or the like added therein in addition to WC); a cermet (including TiC, TiN, TiCN, or the like as a main component); a high-speed steel; a ceramic (titanium carbide, silicon carbide, silicon nitride, aluminum nitride, aluminum oxide, or the like); a cubic boron nitride sintered material (cBN sintered material); and a diamond sintered material. The substrate more preferably includes at least one selected from a group consisting of the cemented carbide, the cermet, and the cBN sintered material.

It should be noted that when the cemented carbide is used as the substrate, the effects of the present embodiment are exhibited even if the cemented carbide includes free carbon or an abnormal phase called η phase in the structure thereof. It should be noted that the substrate used in the present embodiment may have a modified surface. For example, in the case of the cemented carbide, a β-free layer may be formed on the surface. In the case of the cermet, a surface hardening layer may be formed. Even when the surface is thus modified, the effects of the present embodiment are exhibited.

When the cutting tool is an indexable cutting insert (such as an indexable cutting insert for milling), a substrate having a chip breaker or a substrate having no chip breaker may be included. For the shape of the ridgeline portion of the cutting edge, any of the following shapes is included: a sharp edge (ridge at which the rake face and the flank face cross each other); a honing (shape obtained by providing a curvature to the sharp edge); a negative land (chamfered shape); and a shape obtained by combining the honing and the negative land.

<Coating Film>

The "coating film" according to the present embodiment has a function of improving various characteristics in the cutting tool such as breakage resistance, wear resistance, and the like by coating at least a portion (for example, a portion to be brought into contact with a workpiece during cutting) of the substrate. The coating film may coat the entire surface of the substrate. It should be noted that a coating film that does not coat a portion of the substrate and a coating film having a partially different constitution do not deviate from the scope of the present embodiment.

The thickness of the coating film is preferably 0.1 μm or more and 10 μm or less, is more preferably 0.3 μm or more and 10 μm or less, is further preferably 0.5 μm or more and 10 μm or less, is furthermore preferably 1 μm or more and 6 μm or less, and is particularly preferably 1.5 μm or more and 4 μm or less. If the thickness is less than 0.1 μm, the wear resistance tends to be decreased. If the thickness is more than 10 μm, detachment or breakage of the coating film tends to occur highly frequently when large stress is applied between the coating film and the substrate during intermittent processing, for example.

In the present specification, the thickness of the coating film means the total of the thicknesses of the individual layers that constitute the coating film such as the first layer, a second layer (a first unit layer and a second unit layer) and a third layer (a 1A unit layer and a 2A unit layer) to be described below. The thickness of the coating film can be determined, for example, as follows: a transmission electron microscope (TEM) is used to measure thicknesses at three arbitrary points in a cross sectional sample parallel to the normal direction of the surface of the substrate, and the average value of the measured thicknesses at the three points is determined. This is also true in the case of measuring the thickness of each of the first layer, the second layer (the first unit layer and the second unit layer) and the third layer (the 1A unit layer and the 2A unit layer) to be described below. Examples of the transmission electron microscope include "JEM-2100F (trademark)", which is a spherical aberration correction apparatus provided by JEOL.

(First Layer)

The coating film includes the first layer composed of metal tungsten and hexagonal ditungsten carbide. The first layer may include an inevitable impurity as long as the effects exhibited by the cutting tool according to the present embodiment are not compromised. Examples of the inevitable impurity include iron (Fe), calcium (Ca), zinc (Zn), sodium (Na), fluorine (F), nickel (Ni), molybdenum (Mo), chromium (Cr) and the like. The content ratio of the inevitable impurity is preferably 0 mass % or more and 0.2 mass % or less relative to the total mass of the first layer. The content ratio of the inevitable impurity is measured by the glow discharge mass spectrometry. The same applies to the below-described "second layer", "first unit layer", "second unit layer", "third layer", "1A unit layer", "2A unit layer" and "other layers", i.e., an inevitable impurity may be included therein as long as the effects exhibited by the cutting tool according to the present embodiment are not compromised.

The fact that the first layer is composed of metal tungsten and hexagonal ditungsten carbide ($W_2C$) can be confirmed by irradiating the surface of a measurement sample opposite to the substrate with X-rays and thereby performing X-ray diffraction measurement (XRD measurement) on an arbitrary region of the first layer. When the first layer contains metal tungsten, in the XRD measurement, peaks derived from crystal planes, such as a (110) plane and a (220) plane, of metal tungsten are observed. When the first layer contains hexagonal ditungsten carbide, in the XRD measurement, a peak derived from a crystal plane, such as a (011) plane, of hexagonal ditungsten carbide is observed. Specifically, in an X-ray diffraction pattern, the peaks derived from the (110) plane of metal tungsten and the (011) plane of hexagonal ditungsten carbide are observed at $2\theta=39.6°$ to $40.1°$, and the peak derived from the (220) plane of metal tungsten is observed at $2\theta=86.0°$ to $86.5°$.

In the XRD measurement, there are cases where, in addition to the peaks derived from metal tungsten and hexagonal ditungsten carbide in the first layer, peaks derived from the second layer, the third layer and other layers such as an intermediate layer or the substrate (hereinafter, also referred to as "other peaks") are detected. In this case, the peaks derived from the first layer are identified by the following method.

A measurement method when other layers exist on the surface side of the coating film relative to the first layer is as follows. First, the surface of a measurement sample opposite to the substrate is irradiated with X rays to perform XRD measurement, thereby obtaining a diffraction pattern A. Next, layers on the surface side (X-ray irradiation side) of the measurement sample relative to the first layer (other layers) are mechanically removed to expose the first layer. The surface of the exposed first layer is irradiated with X-rays to perform XRD measurement, thereby obtaining a diffraction pattern B. Next, from the measurement sample from which the first layer is exposed, the first layer is mechanically removed to expose the substrate or the layers existing on the substrate side relative to the first layer. The surface of the exposed substrate or layers existing on the substrate side relative to the first layer is irradiated with X-rays to perform XRD measurement, thereby obtaining a diffraction pattern C. The peaks derived from the first layer are identified by comparing the diffraction pattern A, the diffraction pattern B, and the diffraction pattern C.

A measurement method when the first layer is disposed on the outermost side of the coating film and other layers do not exist on the surface side of the coating film relative to the first layer is as follows. First, the surface of a measurement sample opposite to the substrate, that is, the surface of the first layer is irradiated with X rays to perform XRD measurement, thereby obtaining a diffraction pattern B. Next, from the measurement sample, the first layer is mechanically removed to expose the substrate or the layers existing on the substrate side relative to the first layer. The surface of the exposed substrate or layers existing on the substrate side relative to the first layer is irradiated with X-rays to perform XRD measurement, thereby obtaining a diffraction pattern C. The peaks derived from the first layer are identified by comparing the diffraction pattern B and the diffraction pattern C.

It should be noted that when the thickness of the first layer is 1 μm or more, the peaks derived from the first layer can also be identified by performing thin film X-ray measurement with the first layer exposed.

Examples of an apparatus used for the X-ray diffraction measurement include: "SmartLab" (trademark) provided by Rigaku; "X'pert" (trademark) provided by PANalytical; and the like.

In the present specification, the conditions for the XRD measurement are as follows.
(XRD Measurement Conditions)
  Scanning axis: 2θ-θ
  X-ray source: Cu-Kα rays (1.541862 Å)
  Detector: zero-dimension detector (scintillation counter)
  Tube voltage: 45 kV
  Tube current: 40 mA
  Incoming-light optical system: utilization of a mirror
  Light-receiving optical system: utilization of an analyzer crystal (PW3098/27)
  Step: 0.03°
  Integration time: 2 seconds
  Scanning range (2θ): 10° to 120°

It should be noted that, according to measurement by the applicants, it was confirmed that, as long as the analysis is performed on the same sample, the analysis results rarely vary even when the measurement is performed a plurality of times on different measurement regions and it is not unacceptable to arbitrarily set the measurement regions.

The elastic deformation rate of the first layer is 43.0 or more and 58.0 or less. When the elastic deformation rate of the first layer is 43.0 or more, the hardness of the coating film is high, and it is possible for the cutting tool to have excellent wear resistance. The lower limit of the elastic deformation rate of the first layer can be set to 43.0 or more, 44.0 or more or 45.0 or more. When the elastic deformation rate of the first layer is 58.0 or less, cracks are unlikely to be generated in the coating film during usage of the cutting tool, and it is possible for the cutting tool to have excellent breakage resistance. The upper limit of the elastic deformation rate of the first layer can be set to 58.0 or less, 53.0 or less, or 48.5 or less. The elastic deformation rate of the first layer is preferably 44.0 or more and 53.0 or less and more preferably 45.0 or more and 48.5 or less.

Figure 7:
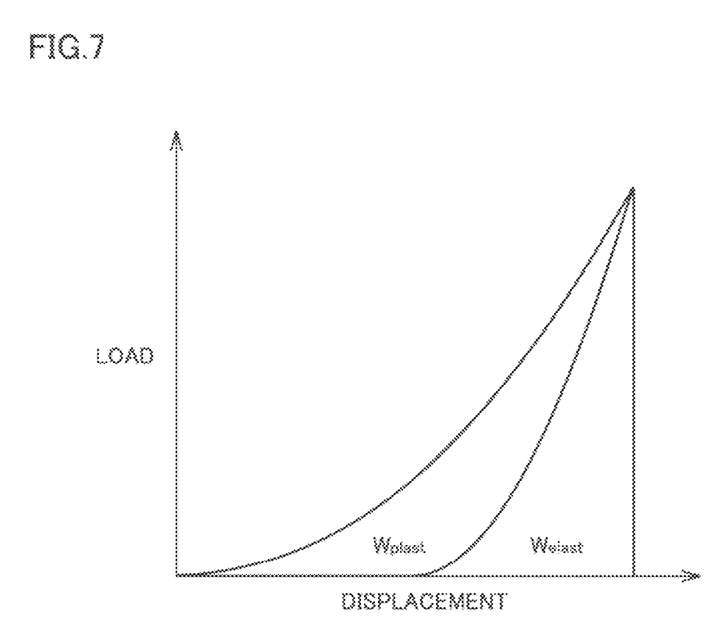
FIG. 7 is a coordinate system showing an example of a load displacement curve that is produced based on nano indentation test results.

In the present specification, the elastic deformation rate of the first layer is measured by a nano indention test according to ISO 14577. Specifically, the elastic deformation rate is measured under the following conditions using a nano indenter ("ENT 1100a" (trademark) provided by Elionix).
(Measurement Conditions in Nano Indenter)
  Indenter material: diamond
  Indenter shape: Berkovich indenter
  Test load: 20 mN
  Number of measurement points: 10 points When other layers exist on the surface side of the coating film relative to the first layer, the measurement is performed after the other layers are removed by mechanical polishing or the like to expose the first layer. Arbitrary 10 points in the first layer are each measured to obtain an elastic deformation rate, and the average value of the obtained elastic deformation rates at the 10 points is regarded as the elastic deformation rate in the first layer. The elastic deformation rate of the first layer is calculated based on the Oliver-Pharr theory from the load displacement curve. FIG. 7 is a coordinate system showing an example of the load displacement curve that is produced based on the nano indentation test results. In the coordinate system of FIG. 7, the X axis indicates displacement and the Y axis indicates load. In the coordinate system of FIG. 7, the sum of an elastic deformation work (a region indicated by $W_{elast}$ in FIG. 7) and a plastic deformation work (a region indicated by $W_{plast}$ in FIG. 7) is the total deformation work $W_{total}$. That is, $W_{total}=W_{elast}+W_{plast}$. The elastic deformation rate ηπ is indicated by the following formula (1).

$$\eta\pi=(W_{elast}/W_{total})\times 100$$

It should be noted that, according to measurement by the applicants, it was confirmed that, as long as the measurement is performed on the same sample, the measurement results rarely vary even when the measurement is performed a plurality of times on different measurement sites and it is not unacceptable to arbitrarily set the measurement sites.

Figure 2:
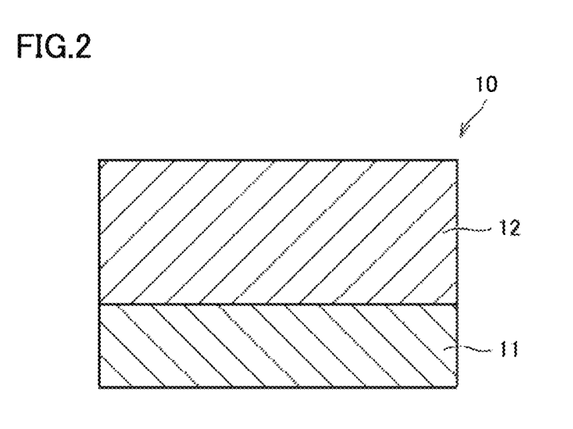
FIG. 2 is a schematic cross-sectional view of a cutting tool in one implementation of the present embodiment.

FIG. 2 is a schematic cross sectional view of the cutting tool in one implementation of the present embodiment. As shown in FIG. 2, first layer 12 may be in contact with substrate 11. In other words, first layer 12 may be provided just above substrate 11.

The lower limit of the thickness of the first layer is preferably 0.3 μm or more. In such a case, a diffusion reaction between the first layer and a workpiece is suppressed. The lower limit of the thickness of the first layer is preferably 0.3 μm or more, 0.5 μm or more or 0.7 μm or more. The upper limit of the thickness of the first layer is preferably 4.0 μm or less. In such a case, the coating film has a high hardness, and the wear resistance is favorable. The upper limit of the thickness of the first layer is preferably 4.0 μm or less, 2.0 μm or less, or 1.5 μm or less. The thickness of the first layer is preferably 0.3 μm or more and 4.0 μm or less, preferably 0.5 μm or more and 2.0 μm or less, and preferably 0.7 μm or more and 1.5 μm or more.
(Second Layer)

Figure 3:
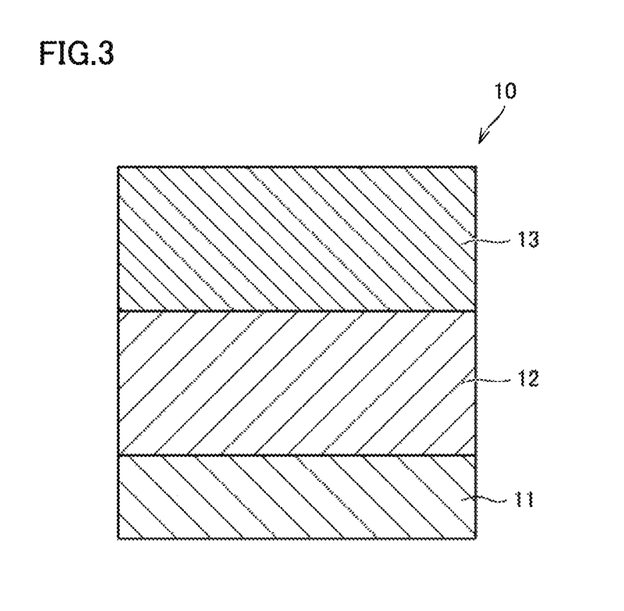
FIG. 3 is a schematic cross-sectional view of a cutting tool in another implementation of the present embodiment.

The coating film preferably further includes the second layer that is disposed on the first layer. Hem, regarding the expression "the second layer that is disposed on the first layer", the second layer and the first layer do not need to be in contact with each other as long as the second layer is provided on the upper side (opposite side to the substrate) relative to the first layer. In other words, another layer may be provided between the first layer and the second layer. Moreover, as shown in FIG. 3, second layer 13 may be provided just above first layer 12. The second layer may be an outermost layer (surface layer).

The second layer preferably includes at least a first unit layer having a composition different from that of the first layer.
(First Unit Layer)

Preferably, the first unit layer is composed of at least one element selected from a group consisting of a group 4 element, a group 5 element, a group 6 element in a periodic table, aluminum (Al), and silicon (Si), or is composed of a compound composed of at least one of the elements and at least one element selected from a group consisting of carbon, nitrogen, oxygen and boron. Examples of the group 4 element in the periodic table include titanium (Ti), zirconium (Zr), hafnium (Hf) and the like. Examples of the group 5 element in the periodic table include vanadium (V), niobium (Nb), tantalum (Ta) and the like. Examples of the group 6 element in the periodic table include chromium (Cr), molybdenum (Mo), tungsten (W) and the like. More preferably, the first unit layer is composed of at least one element selected from a group consisting of Cr, Al, Ti and Si, or is composed of a compound composed of at least one of the elements and at least one element selected from a group consisting of carbon, nitrogen, oxygen and boron.

Examples of the compound constituting the first unit layer include TiAlN, TiAlSiN, TiCrSiN, TiAlCrSiN, ACrN, AlCrO, AlCrSiN, TiZrN, TiAlMoN, TiAlNbN, TiSiN, AlCr- TaN, AlTiVN, TiB$_2$, TiCrHfN, CrSiWN, TiAlCN, TiSiCN, AZrON, AMCrCN, AlHfN, CrSiBON, TiAlWN, AlCrMoCN, TiAlBN, TiAlCrSiBCNO, ZrN, ZtCN, CrWCN, AlTiCrN, TiN, TiBN, and the like.

When the second layer is only constituted of the first unit layer (in the case of FIG. 3, for example), the thickness of the first unit layer (i.e., the second layer) is preferably 0.1 μm or more and 10 μm or less, and is more preferably 0.5 μm or more and 7 μm or less.

(Second Unit Layer)

It is preferable that the second layer further includes, in addition to the first unit layer, a second unit layer and the second unit layer has a composition different from those of the first layer and the first unit layer.

It is preferable that the second unit layer is composed of at least one element selected from a group consisting of a group 4 element, a group 5 element, a group 6 element in a periodic table, aluminum (Al) and silicon (Si), or is composed of a compound composed of at least one of the elements and at least one element selected from a group consisting of carbon, nitrogen, oxygen and boron. More preferably, the second unit layer is composed of at least one element selected from a group consisting of Cr, Al, Ti and Si, or is composed of a compound composed of at least one of the elements and at least one element selected from a group consisting of carbon, nitrogen, oxygen and boron. Specific examples of the group 4 element, the group 5 element, and the group 6 element in the periodic table include the elements illustrated above.

Examples of the compound constituting the second unit layer include the compounds illustrated regarding the first unit layer and the like.

Figure 4:
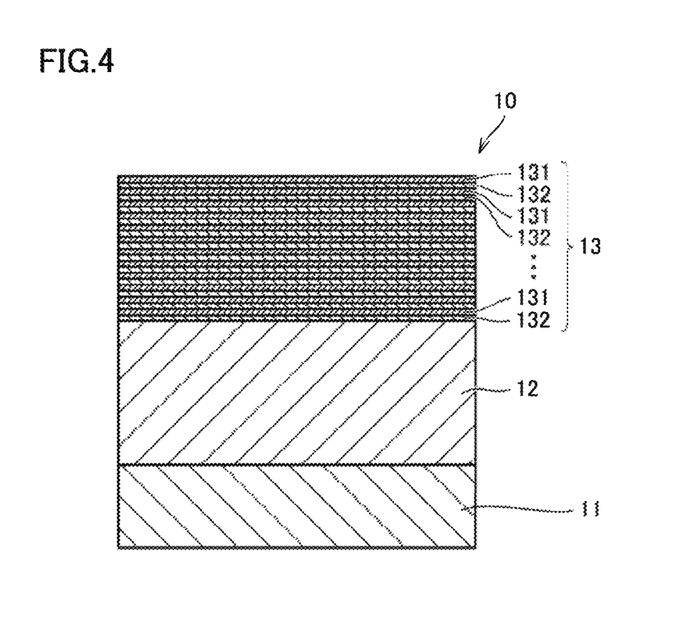
FIG. 4 is a schematic cross-sectional view of a cutting tool in still another implementation of the present embodiment.

Further, one or a plurality of the first unit layers and one or a plurality of the second unit layers are preferably layered on each other alternately to form a multilayer structure. That is, as shown in FIG. 4, second layer 13 preferably includes a multilayer structure including first unit layers 131 and second unit layers 132. Here, in the multilayer structure, the layering of the first and second unit layers may be started from the first unit layer or the second unit layer. That is, an interface of the multilayer structure at the first layer side may be constituted of the first unit layer or the second unit layer. Moreover, an interface of the multilayer structure opposite to the first layer side may be constituted of the first unit layer or the second unit layer.

When the second layer includes the above-described multilayer structure, the thickness of the second layer is preferably 0.1 μm or more and 10 μm or less, and is more preferably 0.5 μm or more and 7 μm or less.

When the second layer includes the above-described multilayer structure, the thickness of the first unit layer is preferably 1 nm or more and 100 nm or less, and is more preferably 2 nm or more and 25 nm or less. Further, the thickness of the second unit layer is preferably 1 nm or more and 100 nm or less, and is more preferably 2 nm or more and 25 nm or less. In one implementation of the present embodiment, when the second layer includes the above-described multilayer structure, it is preferable that the thickness of the first unit layer is 1 nm or more and 100 nm or less and the thickness of the second unit layer is 1 nm or more and 100 nm or less. Here, the "thickness of the first unit layer" refers to the thickness of one first unit layer. The "thickness of the second unit layer" refers to the thickness of one second unit layer.

Moreover, regarding the number of layers of the multilayer structure, the embodiment encompasses a case where one first unit layer and one second unit layer are layered, and preferably, 20 to 2500 first unit layers and 20 to 2500 second unit layers can be layered, as long as the thickness of the whole of the second layer falls within the above-described range.

(Third Layer)

Figure 5:
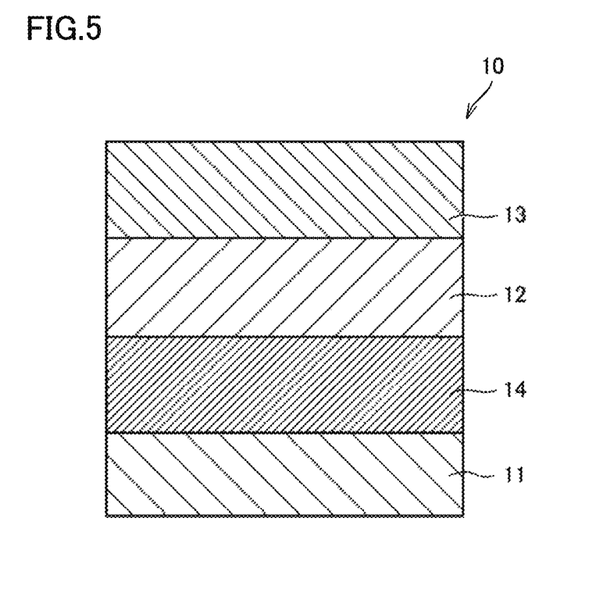
FIG. 5 is a schematic cross-sectional view of a cutting tool in still another implementation of the present embodiment.

The coating film preferably further includes the third layer that is disposed below the first layer. Here, regarding the expression "the third layer that is disposed below the first layer", the third layer and the first layer do not need to be in contact with each other as long as the third layer is provided on the lower side (substrate side) relative to the first layer. In other words, another layer may be provided between the first layer and the third layer. Moreover, as shown in FIG. 5, a third layer 14 may be provided just below first layer 12.

The third layer preferably includes at least a 1A unit layer having a composition different from that of the first layer.

(1A Unit Layer)

Preferably, the 1A unit layer is composed of at least one element selected from a group consisting of a group 4 element, a group 5 element, a group 6 element in a periodic table, aluminum (Al) and silicon (Si), or is composed of a compound composed of at least one of the elements and at least one element selected from a group consisting of carbon, nitrogen, oxygen and boron. Examples of the group 4 element in the periodic table include titanium (Ti), zirconium (Zr), hafnium (Hf) and the like. Examples of the group 5 element in the periodic table include vanadium (V), niobium (Nb), tantalum (Ta) and the like. Examples of the group 6 element in the periodic table include chromium (Cr), molybdenum (Mo), tungsten (W) and the like. More preferably, the first unit layer is composed of at least one element selected from a group consisting of Cr, Al, Ti and Si, or is composed of a compound composed of at least one of the elements and at least one element selected from a group consisting of carbon, nitrogen, oxygen and boron.

Examples of the compound constituting the 1A unit layer include TiAlN, TiAlSiN, TiCrSiN, TiAlCrSiN, ACrN, AlCrO, AlCrSiN, TiZrN, TiAlMoN, TiAlNbN, TiSiN, AlCrTaN, AlTiVN, TiB$_2$, TiCrHfN, CrSiWN, TiAlCN, TiSiCN, AZrON, AlCrCN, AlHfN, CrSiBON, TiAlWN, AlCrMoCN, TiAlBN, TiAlCrSiBCNO, ZrN, ZrCN, CrWCN, AlTiCrN, TiN, TiBN, and the like.

When the third layer is only constituted of the 1A unit layer, the thickness of the 1A unit layer (i.e., the third layer) is preferably 0.1 μm or more and 10 μm or less, and is more preferably 0.5 μm or more and 7 μm or less.

(2A Unit Layer)

It is preferable that the third layer further includes, in addition to the 1A unit layer, a 2A unit layer and the 2A unit layer has a composition different from those of the first layer and the 1A unit layer.

Preferably, the 2A unit layer is composed of at least one element selected from a group consisting of a group 4 element, a group 5 element, a group 6 element in a periodic table, aluminum (Al) and silicon (Si), or is composed of a compound composed of at least one of the elements and at least one element selected from a group consisting of carbon, nitrogen, oxygen and boron. More preferably, the 2A unit layer is composed of at least one element selected from a group consisting of Cr, Al, Ti and Si, or is composed of a compound composed of at least one of the elements and at least one element selected from a group consisting of carbon, nitrogen, oxygen and boron. Specific examples of the group 4 element, the group 5 element, and the group 6 element in the periodic table include the elements illustrated above.

Examples of the compound constituting the 2A unit layer include the compounds illustrated regarding the 1A unit layer and the like.

Figure 6:
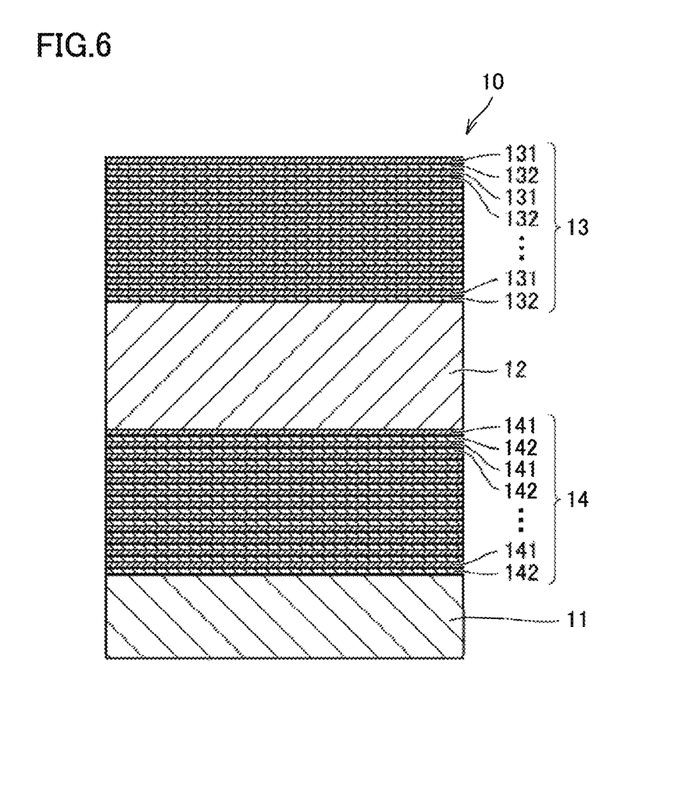
FIG. 6 is a schematic cross-sectional view of a cutting tool in still another implementation of the present embodiment.

Further, one or a plurality of the 1A unit layers and one or a plurality of the 2A unit layers are preferably layered on each other alternately to form a multilayer structure. That is, as shown in FIG. 6, third layer 14 preferably includes a multilayer structure including 1A unit layers 141 and 2A unit layers 142. Here, in the multilayer structure, the layering of the 1A and 2A unit layers may be started from the 1A unit layer or the 2A unit layer. That is, an interface of the multilayer structure on a side opposite to the first layer (that is, the substrate side) may be constituted of the 1A unit layer or the 2A unit layer. Moreover, an interface of the multilayer structure on the first layer side may be constituted of the 1A unit layer or the 2A unit layer.

When the third layer includes the above-described multilayer structure, the thickness of the third layer is preferably 0.1 µm or more and 10 µm or less, and is more preferably 0.5 µm or more and 7 µm or less.

When the third layer includes the above-described multilayer structure, the thickness of the 1A unit layer is preferably 1 nm or more and 100 nm or less, and is more preferably 2 nm or more and 25 nm or less. Further, the thickness of the 2A unit layer is preferably 1 nm or more and 100 nm or less, and is more preferably 2 nm or more and 25 nm or less. In one implementation of the present embodiment, when the third layer includes the above-described multilayer structure, it is preferable that the thickness of the 1A unit layer is 1 nm or more and 100 nm or less and the thickness of the 2A unit layer is 1 nm or more and 100 nm or less. Here, the "thickness of the 1A unit layer" refers to the thickness of one 1A unit layer. The "thickness of the 2A unit layer" refers to the thickness of one 2A unit layer.

Moreover, regarding the number of layers of the multilayer structure, the embodiment encompasses a case where one 1A unit layer and one 2A unit layer are layered, and preferably, 20 to 2500 1A unit layers and 20 to 2500 2A unit layers can be layered, as long as the thickness of the whole of the third layer falls within the above-described range.

(Other Layers)

As long as the effects of the present embodiment are not compromised, the coating film may further include other layers. The other layers may each have a composition different from or the same as the composition of each of the first layer and the second layer. Examples of the other layers include a TiN layer, a TiWCN layer, and the like. It should be noted that an order of layering these layers is particularly not limited. Examples of the other layers include the intermediate layer that is provided between the first material and the second layer, the surface layer that is provided on the outermost layer of the tool. The thickness of each of the other layers is not particularly limited as long as the effects of the present embodiment are not compromised. For example, the thickness of each of the other layers is 0.1 µm or more and 2 µm or less.

Embodiment 2: Method for Manufacturing Cutting Tool

A method for manufacturing the cutting tool of Embodiment 1 will be described below. It should be noted that the following manufacturing method is an example, and the cutting tool of Embodiment 1 may be manufactured by a different method. A method for manufacturing the cutting tool according to the present embodiment includes a substrate preparing step and a first layer coating step. Hereinafter, each of the steps will be described.

<Substrate Preparing Step>

In the substrate preparing step, the substrate is prepared. As the substrate, any conventionally known substrate for such a purpose of use can be used as described above. For example, when the substrate is composed of a cemented carbide, source material powder, which has a predetermined blending composition (mass %), is first mixed uniformly using a commercially available attritor. Then, this powder mixture is pressed and shaped into a predetermined shape (for example, SEET13T3AGSN, CNMG120408, and the like). Then, in a predetermined sintering furnace, the powder mixture having been pressed and shaped is sintered at 1300 to 1500° C. for 1 to 2 hours, thereby obtaining the substrate composed of the cemented carbide. Moreover, a commercially available product may be used for the substrate without modification.

<First Layer Coating Step>

In the first layer coating step, at least a portion of the surface of the substrate is coated with the first layer. Here, the expression "at least a portion of the surface of the substrate" includes a portion to be brought into contact with a workpiece during cutting.

As a method for coating at least a portion of the substrate with the first layer, the first layer can be formed by a physical vapor deposition method (PVD method), for example.

Examples of the physical vapor deposition method can include a sputtering method, an ion plating method, an arc ion plating method, an electronic ion beam deposition method, and the like. When the cathode arc ion plating method or sputtering method involving a particularly high ionization rate of a material element is used, a metal or gas ion bombardment process can be performed onto the surface of the substrate before forming the coating film. This is preferable because adhesion between the coating film and the substrate is remarkably improved accordingly.

When the first layer is formed by the arc ion plating method, the following conditions can be employed, for example. First, a WC target (for example, binderless WC composed of 93 mass % or more of WC and sintering target having a C amount of 3 to 6.1 mass %) is set at two facing arc type evaporation sources in an apparatus. A substrate temperature is set to 400 to 550° C., and a gas pressure in the apparatus is set to 1.0 to 4.0 Pa.

As the gas, only an argon gas or a mixed gas of a methane gas, which is a hydrocarbon-based gas, and an argon gas is introduced. Here, examples of the hydrocarbon-based gas include an acetylene gas, a methane gas, and the like.

While maintaining a substrate (negative) bias voltage to 10 to 150 V and to DC or pulse DC (frequency of 20 to 350 kHz), an arc current of 80 to 150 A is supplied to a cathode electrode, and metal ions and the like are generated from the arc type evaporation source, thereby forming the first layer. During film formation, tungsten filaments are also discharged (emission current of 10 A or more and less than 25 A). This makes it possible to increase ions in plasma. Examples of the apparatus used for the arc ion plating method include AIP (trademark) provided by Kobe Steel.

The first layer is formed under the above-described conditions, whereby the first layer is composed of metal tungsten and hexagonal ditungsten carbide, and the elastic deformation rate of the first layer becomes 43.0 or more and 58.0 or less. The above-described conditions were newly found by the present inventors as a result of trial and error.

<Second Layer Coating Step>

The method for manufacturing the cutting tool according to the present embodiment preferably further includes the second layer coating step after the first layer coating step. The second layer can be formed using a conventional method without a particular limitation. Specifically, for example, the second layer can be formed by the PVD method described above.

<Third Layer Coating Step>

The method for manufacturing the cutting tool according to the present embodiment preferably further includes a third layer coating step before the first layer coating step. The third layer can be formed using a conventional method without a particular limitation. Specifically, for example, the third layer may be formed by the PVD method described above.

<Other Steps>

In addition to the steps described above, in the manufacturing method according to the present embodiment, the following steps may be performed appropriately: an intermediate layer coating step of forming the intermediate layer between the first layer and the second layer; a surface layer coating step of forming the surface layer on the outermost surface of the coating film; a step of performing a surface treatment; and the like. When the above-described other layers such as the intermediate layer and the surface layer are formed, the other layers may be formed by a conventional method. Specifically, for example, the other layers may be formed by the PVD method described above. Examples of the step of performing a surface treatment include: a surface treatment using a medium in which diamond powder is carried in an elastic material; and the like. Examples of an apparatus for performing the above-described surface treatment include Sirius Z provided by Fuji Manufacturing, and the like.

EXAMPLES

While the present invention will be described in detail with reference to Examples, the present invention is not limited thereto.

<<Production of Cutting Tool>>

[Specimen 1 to Specimen 27, Specimen 1-3, and Specimen 1-4]

<Substrate Preparing Step>

First, as the substrate preparing step, a JIS K10 carbide (shape: JIS RCMT1204) was prepared as a substrate. Next, the substrate was set at a predetermined position of an arc ion plating apparatus (trademark: AIP provided by Kobe Steel).

<First Layer Coating Step>

As the first layer coating step, a first layer was formed on the substrate by the arc ion plating method. Specifically, the following method was performed. First, a WC target (binderless WC composed of 93 mass % or more of WC and sintering target having a C amount of 3 to 6.1 mass %) was set at two facing arc type evaporation sources in an apparatus. A substrate temperature was set to 400 to 550° C., and a gas pressure in the apparatus was set to 1.0 to 4.0 Pa.

As the gas, only an argon gas or a mixed gas of a methane gas, which is a hydrocarbon-based gas, and an argon gas was introduced.

In Specimen 1 to Specimen 27, while maintaining a substrate (negative) bias voltage to 10 to 150 V and to DC or pulse DC (frequency of 20 to 350 kHz), an arc current of 80 to 150 A was supplied to a cathode electrode, and metal ions and the like were generated from the arc type evaporation source, thereby forming the first layer. During film formation, tungsten filaments were also discharged (emission current of 10 A or more and less than 25 A).

In Specimen 1-3 and Specimen 1-4, while maintaining a substrate (negative) bias voltage to 160 V and to DC or pulse DC (frequency of 20 to 350 kHz), an arc current of 80 to 150 A was supplied to a cathode electrode, and metal ions and the like were generated from the arc type evaporation source, thereby forming the first layer. During film formation, tungsten filaments were also discharged (emission current of 5 to 9.5 A).

<Third Layer Coating Step>

For samples (Specimen 18 to Specimen 23) in each of which the third layer was provided between the substrate and the first layer, the third layer was formed on the substrate in the following procedure before performing the first layer coating step. First, a target (sintering target or melting target) including a metal composition in the column of the composition of the third layer as described in Table 1 and Table 2 was set at the arc type evaporation source of the arc ion plating apparatus. Next, the substrate temperature was set to 400 to 650° C. and the gas pressure in the apparatus was set to 0.8 to 5 Pa. In the case of a nitride third layer, a mixed gas of a nitrogen gas and an argon gas was introduced as a reactive gas. In the case of a carbonitride third layer, a mixed gas of a nitrogen gas, a methane gas, and an argon gas was introduced as the reactive gas. Then, an arc current of 80 to 150 A was supplied to the cathode electrode. By supplying the arc current, metal ions and the like were generated from the arc type evaporation source, whereby the third layer was formed to have a thickness described in Table 1 and Table 2. It should be noted that when forming a third layer having a multilayer structure (Specimen 21), respective compositions sequentially described in Table 1 from the left side were repeatedly layered as 1A and 2A unit layers until a target thickness was attained, thereby forming the third layer.

<Second Layer Coating Step>

Moreover, for samples (Specimen 22 and Specimen 23) in each of which a second layer was provided on the first layer, the second layer was formed on the first layer in the following procedure after performing the first layer coating step, thereby producing a cutting tool according to the present embodiment.

In Specimen 22, a $TiB_2$ layer, which was a second layer, was produced by a HiPIMS method. First, a $TiB_2$ target was set at an HiPIMS evaporation source of a combined apparatus of an arc ion plating apparatus and an HiPIMS apparatus. Next, the inside of a chamber was vacuumed, and an inert gas (Ar) was introduced. Next, a bias voltage was applied to the substrate through a bias power supply, and a pulse voltage was supplied to the target through a HiPIMS power source, thereby causing the HiPIMS apparatus to start a film formation operation. Film formation conditions are as described below.

(Film Formation Conditions)

Target: $TiB_2$

Ar pressure: 0.4 Pa

Average power: 5 kW

Output frequency: 800 Hz

Duty rate: 5%

Bias voltage: 50 V

Substrate temperature: 450° C.

This generated plasma in the chamber and caused ions to collide with the $TiB_2$ target, whereby Ti atoms, Bi atoms, Ti ions, and Bi ions are released from the $TiB_2$ target, and a $TiB_2$ layer having a thickness described in Table 1 was formed on the substrate.

In Specimen 23, first, a target (sintering target or melting target) including a metal composition in the column of the composition of the second layer as described in Table 2 was set at the arc type evaporation source of the arc ion plating apparatus. Next, the substrate temperature was set to 500 to 650° C. and the gas pressure in the apparatus was set to 0.8 to 5.0 Pa. In the case of a nitride second layer, a mixed gas of a nitrogen gas and an argon gas was introduced as a reactive gas. Then, an arc current of 80 to 150 A was supplied to the cathode electrode. By supplying the arc current, metal ions and the like were generated from the arc type evaporation source, whereby respective compositions sequentially described in Table 2 from the left side were repeatedly layered as first and second unit layers until a target thickness was attained.

[Specimen 1-1]
<Substrate Preparing Step>

As the substrate preparing step, the same substrate as that in Specimen 1 was prepared, and the substrate was set at a predetermined position of an arc ion plating apparatus (trademark: AIP provided by Kobe Steel).

<First Layer Coating Step>

As the first layer coating step, a first layer was formed on the substrate by the arc ion plating method. Specifically, the following method was performed. First, a WC target (binderless WC composed of 93 mass % or more of WC and sintering target having a C amount of 3 to 6.1 mass %) was set at two facing arc type evaporation sources in an apparatus. A substrate temperature was set to 400 to 550° C., and a gas pressure in the apparatus was set to 0.3 to 1.5 Pa. As the gas, only an argon gas was introduced.

While maintaining a substrate (negative) bias voltage to 40 V and to DC, an arc current of 130 A was supplied to a cathode electrode, and metal ions and the like were generated from the arc type evaporation source, thereby forming the first layer.

[Specimen 1-2]
<Substrate Preparing Step>

As the substrate preparing step, the same substrate as that in Specimen 1 was prepared, and the substrate was set at a predetermined position of an arc ion plating apparatus (trademark: AIP provided by Kobe Steel).

<First Layer Coating Step>

As the first layer coating step, a first layer was formed on the substrate by the arc ion plating method. Specifically, the following method was performed. First, a WC target (for example, binderless WC composed of 93 mass % or more of WC and sintering target having a C amount of 3 to 6.1 mass %) was set at two facing arc type evaporation sources in an apparatus. A substrate temperature was set to 400 to 550° C., and a gas pressure in the apparatus was set to 0.3 to 1.5 Pa.

As the gas, a mixed gas of a methane gas, which is a hydrocarbon-based gas, and an argon gas was introduced.

While maintaining a substrate (negative) bias voltage to 20 V and to DC, a pulse arc current (frequency of 0.25 Hz) of 120 A was supplied to a cathode electrode, and metal ions and the like were generated from the arc type evaporation source, thereby forming the first layer.

[Specimen 1-5]
<Substrate Preparing Step>

As the substrate preparing step, the same substrate as that in Specimen 1 was prepared, and the substrate was set at a predetermined position of an arc ion plating apparatus (trademark: AIP provided by Kobe Steel).

<First Layer Coating Step>

As the first layer coating step, a first layer was formed on the substrate by the arc ion plating method. Specifically, the following method was performed. First, a WC target (for example, sintering target composed of WC and having a C amount of 3 to 6.1 mass %) was set at two facing arc type evaporation sources in an apparatus. A substrate temperature was set to 450° C., and a gas pressure in the apparatus was set to 1.0 to 1.5 Pa.

As the gas, only an argon gas was introduced.

A substrate (negative) bias voltage was set to 30 V pulse DC (frequencies of 30 kHz and 200 kHz were alternately applied), an arc current of 150 A was supplied to a cathode electrode, and metal ions and the like were generated from the arc type evaporation source, thereby forming the first layer.

<<Evaluation on Characteristics of Cutting Tool>>

By using cutting tools of the samples (Specimen 1 to Specimen 27 and Specimen 1-1 to Specimen 1-5) produced as described above, characteristics of each of the cutting tools were evaluated as described below.

(Composition of First Layer)

The surface of each sample opposite to the substrate was irradiated with X-rays, whereby XRD measurement was performed on the first layer, and the composition and crystal structure of the first layer were specified. It should be noted that when the second layer and/or the third layer were formed, the measurement was performed after these layers were mechanically removed. A specific measurement method is described in Embodiment 1 and thus will not be repeatedly described.

Results thereof are shown in the columns of "Composition" of "First Layer" as described in Table 1 and Table 2. In the columns of "Composition", "W+hW$_2$C" indicates that the first layer is composed of metal tungsten and hexagonal ditungsten carbide, "W" indicates that the first layer is composed of metal tungsten, "W+cWC+hW$_2$C" indicates that the first layer is composed of metal tungsten, cubic tungsten carbide, and hexagonal ditungsten carbide, and "hW$_2$C" indicates that the first layer is composed of hexagonal ditungsten carbide.

(Elastic Deformation Rate)

The surface of each sample was polished with diamond paper or a diamond paste to expose the first layer, and the elastic deformation rate of the first layer was measured. A specific measurement method is described in Embodiment 1 and thus will not be repeatedly described. Results thereof are shown in Table 1 and Table 2.

(Thickness of Each Layer)

Each of the respective thicknesses of the first layer, the third layer, the second layer (the first and second unit layers), and the coating film was determined as follows. First, a transmission electron microscope (TEM) (trademark: JEM-2100F provided by JEOL) was used to measure thicknesses at three arbitrary points in the cross sectional sample parallel to the normal direction of the surface of the substrate. Then, the average value of the measured thicknesses at the three points was determined. Results thereof are shown in the columns of "Thickness" of each layer of Table 1 and Table 2.

The notation "-" in each of the columns "Third Layer" and "Second Layer" in Table 1 and Table 2 indicates that no corresponding layer exists in the coating film. A notation "TiAlBN (8 nm)/TiAlCrN (14 nm)" in the column "Third Layer" indicates that the third layer is constituted of a multilayer structure (total thickness of 2.0 μm) in which TiAlBN layers each having a thickness of 8 nm and TiAlCrN layers each having a thickness of 14 nm are layered alternately on top of each other. A notation "TiN (10 nm)/TiBN (2 nm)" in the column "Second Layer" indicates that the second layer is constituted of a multilayer structure (total thickness of 1.5 μm) in which TiN layers (first unit layers) each having a thickness of 10 nm and TiBN layers (second unit layers) each having a thickness of 2 nm are layered alternately on top of each other.

to Specimen 1-5 correspond to comparative examples. In view of the results of the cutting test, it was found that the cutting tools of Specimen 1 to Specimen 27 have more excellent breakage resistances and longer tool lives than those of the cutting tools of Specimen 1-1 to Specimen 1-5.

TABLE 1

| Sample | First layer Composition | First layer Elastic deformation rate | First layer Thickness (μm) | Third layer Composition | Third layer Thickness (μm) | Second layer Composition | Second layer Thickness (μm) | Cutting test Tool life |
|---|---|---|---|---|---|---|---|---|
| 1 | W + hW$_2$C | 43.0 | 2.0 | — | — | — | — | 45 min 14 sec |
| 2 | W + hW$_2$C | 43.9 | 2.0 | — | — | — | — | 44 min 29 sec |
| 3 | W + hW$_2$C | 44.0 | 2.0 | — | — | — | — | 47 min 19 sec |
| 4 | W + hW$_2$C | 45.0 | 2.0 | — | — | — | — | 48 min 49 sec |
| 5 | W + hW$_2$C | 46.8 | 2.0 | — | — | — | — | 49 min 46 sec |
| 6 | W + hW$_2$C | 47.2 | 2.0 | — | — | — | — | 49 min 12 sec |
| 7 | W + hW$_2$C | 48.5 | 2.0 | — | — | — | — | 50 min 8 sec |
| 8 | W + hW$_2$C | 49.3 | 2.0 | — | — | — | — | 47 min 7 sec |
| 9 | W + hW$_2$C | 52.6 | 2.0 | — | — | — | — | 47 min 41 sec |
| 10 | W + hW$_2$C | 56.3 | 2.0 | — | — | — | — | 45 min 50 sec |
| 11 | W + hW$_2$C | 46.8 | 1.5 | — | — | — | — | 50 min 20 sec |
| 12 | W + hW$_2$C | 46.8 | 0.9 | — | — | — | — | 52 min 35 sec |
| 13 | W + hW$_2$C | 46.8 | 0.7 | — | — | — | — | 50 min 54 sec |
| 14 | W + hW$_2$C | 47.2 | 0.3 | — | — | — | — | 45 min 14 sec |
| 15 | W + hW$_2$C | 47.0 | 0.5 | — | — | — | — | 49 min 23 sec |
| 16 | W + hW$_2$C | 47.2 | 3.0 | — | — | — | — | 48 min 4 sec |
| 17 | W + hW$_2$C | 47.2 | 3.8 | — | — | — | — | 44 min 52 sec |
| 18 | W + hW$_2$C | 46.8 | 0.9 | CrWCN | 0.02 | — | — | 54 min 17 sec |
| 19 | W + hW$_2$C | 46.8 | 0.9 | AlTiBN | 2.0 | — | — | 61 min 4 sec |
| 20 | W + hW$_2$C | 46.8 | 0.9 | TiAlSiN | 2.0 | — | — | 58 min 37 sec |
| 21 | W + hW$_2$C | 46.8 | 0.9 | TiAlBN (8 nm)/TiAlCrN (14 nm) | 2.0 | — | — | 71 min 26 sec |
| 22 | W + hW$_2$C | 46.8 | 0.9 | AlTiBN | 2.0 | TiB$_2$ | 0.5 | 68 min 25 sec |

TABLE 2

| Sample | First layer Composition | First layer Elastic deformation rate | First layer Thickness (μm) | Third layer Composition | Third layer Thickness (μm) | Second layer Composition | Second layer Thickness (μm) | Cutting test Tool life |
|---|---|---|---|---|---|---|---|---|
| 23 | W + hW$_2$C | 46.8 | 0.9 | AlTiBN | 2.0 | TiN (10 nm)/TiBN (2 nm) | 1.5 | 72 min 0 sec |
| 24 | W + hW$_2$C | 58.0 | 2.0 | — | — | — | — | 45 min 11 sec |
| 25 | W + hW$_2$C | 47.0 | 4.0 | — | — | — | — | 44 min 16 sec |
| 26 | W + hW$_2$C | 47.1 | 0.2 | — | — | — | — | 39 min 14 sec |
| 27 | W + hW$_2$C | 47.1 | 4.2 | — | — | — | — | 43 min 8 sec |
| 1-1 | W | 48.3 | 2.0 | — | — | — | — | 16 min 59 sec |
| 1-2 | W + cWC + hW$_2$C | 46.9 | 2.0 | — | — | — | — | 27 min 43 sec |
| 1-3 | W + hW$_2$C | 41.8 | 2.0 | — | — | — | — | 35 min 4 sec |
| 1-4 | W + hW$_2$C | 60.8 | 2.0 | — | — | — | — | 39 min 1 sec |
| 1-5 | hW$_2$C | 53.6 | 2.0 | — | — | — | — | 20 min 55 sec |

<<Cutting Test>>

Under below-described cutting conditions, a cutting time (tool life) for cutting with the use of each of the cutting tools produced as described above until the cutting tool was broken was measured. Results thereof are shown in the column of "Tool Life" of "Cutting Test" as described in Table 2.

(Cutting Conditions)
Workpiece (material): Ti-6Al-4V
Speed: V50 m/min
Feed: 0.1 mm/blade
Notch: ad 10 mm, ae 10 mm The above-described cutting conditions correspond to the milling of a titanium alloy, and a high heat load is applied to the cutting tool during the processing.

The cutting tools of Specimen 1 to Specimen 27 correspond to the examples, and the cutting tools of Specimen 1-1 This suggested that each of the cutting tools of Specimen 1 to Specimen 27 is suitable for uses in environments with a high heat load during processing.

Heretofore, the embodiments and examples of the present invention have been illustrated, but it has been initially expected to appropriately combine configurations of the embodiments and examples.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

1: rake face; 2: flank face; 3: cutting edge ridgeline portion; 10: cutting tool; 11: substrate; 12: first layer; 13:

second layer; 131: first unit layer; 132: second unit layer, 14: third layer, 141: 1A unit layer, 142: 2A unit layer

The invention claimed is:

1. A cutting tool comprising a substrate and a coating film that is disposed on the substrate, wherein
the coating film includes a first layer composed of metal tungsten and hexagonal ditungsten carbide, and
the first layer has an elastic deformation rate of 43.0 or more and 58.0 or less.

2. The cutting tool according to claim 1, wherein the first layer has a thickness of 0.3 μm or more and 4.0 μm or less.

3. The cutting tool according to claim 1, wherein
the coating film further includes a second layer that is disposed on the first layer,
the second layer includes at least a first unit layer having a composition different from a composition of the first layer, and
the first unit layer is composed of at least one element selected from a group consisting of a group 4 element, a group 5 element, a group 6 element in a periodic table, aluminum and silicon, or is composed of a compound composed of at least one of the elements and at least one element selected from a group consisting of carbon, nitrogen, oxygen and boron.

4. The cutting tool according to claim 3, wherein
the second layer further includes a second unit layer,
the second unit layer has a composition different from compositions of the first layer and the first unit layer,
the second unit layer is composed of at least one element selected from a group consisting of a group 4 element, a group 5 element, a group 6 element in a periodic table, aluminum and silicon, or is composed of a compound composed of at least one of the elements and at least one element selected from a group consisting of carbon, nitrogen, oxygen and boron, and
one or a plurality of the first unit layers and one or a plurality of the second unit layers are layered alternately on each other to form a multilayer structure.

5. The cutting tool according to claim 4, wherein the first unit layer has a thickness of 1 nm or more and 100 nm or less, and the second unit layer has a thickness of 1 nm or more and 100 nm or less.

6. The cutting tool according to claim 1, wherein
the coating film further includes a third layer that is disposed below the first layer,
the third layer includes at least a 1A unit layer having a composition different from a composition of the first layer, and
the 1A unit layer is composed of at least one element selected from a group consisting of a group 4 element, a group 5 element, a group 6 element in a periodic table, aluminum and silicon, or is composed of a compound composed of at least one of the elements and at least one element selected from a group consisting of carbon, nitrogen, oxygen and boron.

7. The cutting tool according to claim 6, wherein
the third layer further includes a 2A unit layer,
the 2A unit layer has a composition different from compositions of the first layer and the 1A unit layer,
the 2A unit layer is composed of at least one element selected from a group consisting of a group 4 element, a group 5 element, a group 6 element in a periodic table, aluminum and silicon, or is composed of a compound composed of at least one of the elements and at least one element selected from a group consisting of carbon, nitrogen, oxygen and boron, and
one or a plurality of the 1A unit layers and one or a plurality of the 2A unit layers are layered alternately on each other to form a multilayer structure.

8. The cutting tool according to claim 7, wherein the 1A unit layer has a thickness of 1 nm or more and 100 nm or less, and the 2A unit layer has a thickness of 1 nm or more and 100 nm or less.

9. The cutting tool according to claim 1, wherein the substrate includes at least one selected from a group consisting of a cemented carbide, a cermet, a high-speed steel, a ceramic, a cBN sintered material and a diamond sintered material.

10. The cutting tool according to claim 1, wherein the elastic deformation rate is measured by a nano indention test under a condition that Test load is 20 mN according to ISO 14577.

11. The cutting tool according to claim 3, wherein the second layer is only constituted of the first unit layer,
a thickness of the second layer is 0.1 μm or more and 10 μm or less.

12. The cutting tool according to claim 4, wherein a thickness of the second layer is 0.1 μm or more and 10 μm or less.

13. The cutting tool according to claim 6, wherein the third layer is only constituted of the 1A unit layer,
a thickness of the third layer is 0.1 μm or more and 10 μm or less.

14. The cutting tool according to claim 7, wherein a thickness of the third layer is 0.1 μm or more and 10 μm or less.

15. The cutting tool according to claim 3, wherein the compound is at least one compound selected from a group consisting of $TiB_2$, TiN, and TiBN.

* * * * *